United States Patent
Chuang et al.

(10) Patent No.: US 10,270,026 B2
(45) Date of Patent: Apr. 23, 2019

(54) MULTILAYERED SPACER STRUCTURE FOR A MAGNETIC TUNNELING JUNCTION AND METHOD OF MANUFACTURING

(71) Applicant: TAIWAN SEMICONDUCTOR MANUFACTURING COMPANY LTD., Hsinchu (TW)

(72) Inventors: Harry-Hak-Lay Chuang, Crescent (SG); Sheng-Huang Huang, Hsinchu (TW); Hung Cho Wang, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/442,225

(22) Filed: Feb. 24, 2017

(65) Prior Publication Data
US 2018/0248112 A1 Aug. 30, 2018

(51) Int. Cl.
*H01L 43/02* (2006.01)
*H01L 43/08* (2006.01)
*H01L 43/10* (2006.01)
*H01L 43/12* (2006.01)

(52) U.S. Cl.
CPC ............. *H01L 43/08* (2013.01); *H01L 43/02* (2013.01); *H01L 43/10* (2013.01); *H01L 43/12* (2013.01)

(58) Field of Classification Search
None
See application file for complete search history.

(56) References Cited

U.S. PATENT DOCUMENTS

| 5,573,965 | A | * | 11/1996 | Chen | H01L 21/28176 257/E21.194 |
| 2008/0206895 | A1 | * | 8/2008 | Asao | H01L 43/08 438/3 |
| 2009/0209050 | A1 | * | 8/2009 | Wang | H01L 27/228 438/3 |
| 2010/0044752 | A1 | * | 2/2010 | Marui | H01L 29/66462 257/192 |
| 2010/0200900 | A1 | * | 8/2010 | Iwayama | B82Y 25/00 257/295 |
| 2013/0032908 | A1 | * | 2/2013 | Tang | H01L 43/08 257/421 |
| 2017/0213870 | A1 | * | 7/2017 | Sim | H01L 27/2481 |

* cited by examiner

*Primary Examiner* — Erik Kielin
(74) *Attorney, Agent, or Firm* — WPAT, P.C., Intellectual Property Attorneys; Anthony King

(57) ABSTRACT

A semiconductor structure is disclosed. The semiconductor structure includes: an Nth metal layer; a bottom electrode over the Nth metal layer; a magnetic tunneling junction (MTJ) over the bottom electrode; a top electrode over the MTJ; a spacer, including: a first spacer layer including SiN with a first atom density, the first spacer layer laterally encompassing the MTJ; and a second spacer layer including SiN with a second atom density different from the first atom density, the second spacer layer laterally encompassing at least a portion of the first spacer layer; and an (N+1)th metal layer over the top electrode. A method for manufacturing a semiconductor structure is also disclosed.

20 Claims, 20 Drawing Sheets ures of the provided subject matter. Specific examples of
MULTILAYERED SPACER STRUCTURE FOR A MAGNETIC TUNNELING JUNCTION AND METHOD OF MANUFACTURING

BACKGROUND

Semiconductor memories are used in integrated circuits for electronic applications, including radios, televisions, cell phones, and personal computing devices. One type of semiconductor memory device involves spin electronics, which combines semiconductor technology and magnetic materials and devices. The spin of electrons, through their magnetic moments, rather than the charge of the electrons, is used to indicate a bit.

One such spin electronic device is a magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
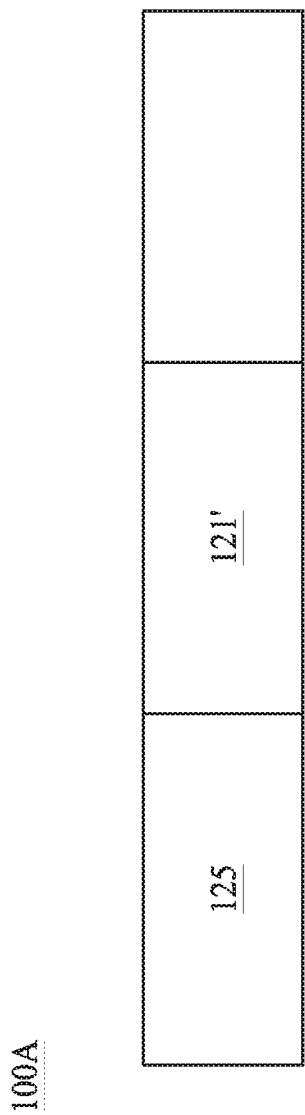
FIGS. 1 to 20 are cross-sectional views of an MRAM cell region structure fabricated at various stages, in accordance with an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The development of embedded magnetoresistive random access memory (MRAM) cells in CMOS structures has been continuously enhanced. A semiconductor circuit with embedded MRAM cells includes an MRAM cell region and a logic region separated from the MRAM cell region. For example, the MRAM cell region may locate at the center of the aforesaid semiconductor circuit while the logic region may locate at a periphery of the semiconductor circuit. Note that the previous statement is not intended to be limiting. Other arrangement regarding the MRAM cell region and the logic region are enclosed in the contemplated scope of the present disclosure.

In the MRAM cell region, a transistor structure can be disposed under the MRAM structure. In some embodiments, the MRAM cell is embedded in the metallization layer prepared in a back-end-of-line (BEOL) operation. For example, the transistor structures in the MRAM cell region and in the logic region are disposed in a common semiconductor substrate, prepared in a front-end-of-line operation, and are substantially identical in the aforesaid two regions in some embodiments. The MRAM cell can be embedded in any position of the metallization layer, for example, between adjacent metal line layers distributed horizontally parallel to a surface of the semiconductor substrate. For instance, the embedded. MRAM can be located between the $4^{th}$ metal line layer and the $5^{th}$ metal line layer in an MRAM cell region. Horizontally shifted to the logic region, the $4^{th}$ metal line layer is connected to the $5^{th}$ metal line layer though a $4^{th}$ metal via. In other words, taking the MRAM cell region and the logic region into consideration, the embedded MRAM occupies a thickness of at least a portion of the $5^{th}$ metal line layer and the $4^{th}$ metal via. The number provided for the metal line layer herein is not limiting. In general, people having ordinary skill in the art can understand that the MRAM is located between an $N^{th}$ metal line layer and an $(N+1)^{th}$ metal line layer, where N is an integer greater than or equal to 1.

The embedded MRAM includes a magnetic tunneling junction (MTJ) composed of ferromagnetic materials. A bottom electrode and a top electrode are electrically coupled to the MTJ for signal/bias conveyance. Following the example previously provided, the bottom electrode is further connected to the $N^{th}$ metal line layer, whereas the top electrode is further connected to the $(N+1)^{th}$ metal line layer.

The MTJ is a form of tunneling magnetoresistive (TMR) device in which the relative orientation of uni-directional magnetic moments in parallel, vertically separated upper and lower magnetized layers, controls the flow of spin-polarized electrons tunneling through a very thin dielectric layer (the tunneling barrier layer) formed between those layers. When injected electrons pass through the upper layer, they are spin polarized by interaction with the magnetic moment of that layer. The probability of such an electron then tunneling through the intervening tunneling barrier layer into the lower layer then depends on the availability of states within the lower electrode that the tunneling electron can occupy. This number, in turn, depends on the magnetization direction of the lower electrode. The tunneling probability is thereby spin dependent and the magnitude of the current (tunneling probability times the number of electrons impinging on the barrier layer) depends upon the relative orientation of the magnetizations of magnetic layers above and below the barrier layer.

One of the critical challenges in MRAM technology is the patterning of the bottom electrode. In a scalable MRAM fabrication process, chlorine gas is used to etch the bottom electrode defined by self-aligned spacer. Unfortunately, the existing spacer is not strong enough to protect a very thin tunneling barrier layer, typically a layer of metallic oxide materials, such as MgO, approximately in a range from about 10 Å to about 20 Å in thickness during the bottom electrode etching process. The chlorine gas may attack and hollow out the tunneling barrier layer, resulting in peeling of the MTJ and therefore introducing yield and reliability issues.

FIGS. 1 to 20 are cross-sectional views of an MRAM cell region structure fabricated at various stages, in accordance with an exemplary embodiment of the present disclosure. In FIG. 1, a predetermined MRAM cell region 100A is provided. In some embodiments, a transistor structure is preformed in a semiconductor substrate (not shown in FIG. 1). The integrated circuit device may undergo further CMOS or MOS technology processing to form various features known in the art. For example, one or more contact plugs, such as silicide regions, may also be formed. The contact features may be coupled to the source and drain. The contact features include silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. In an example, the contact features are formed by a salicide (self-aligned silicide) process.

As shown in FIG. 1, an $N^{th}$ metal line 121' is patterned in a dielectric layer 125 over the transistor structure. In some embodiments, the $N^{th}$ metal line 121' can be formed of an electroplating operation with a Cu seed layer deposited over the patterned dielectric layer 125. As mentioned above, N is an integer greater than or equal to 1. In other embodiments, the $N^{th}$ metal line 121' may be formed by a variety of techniques, e.g., electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. A planarization operation is performed to expose a top surface of the $N^{th}$ metal line 121' and the top surface of the dielectric layer 125.

Figure 2:
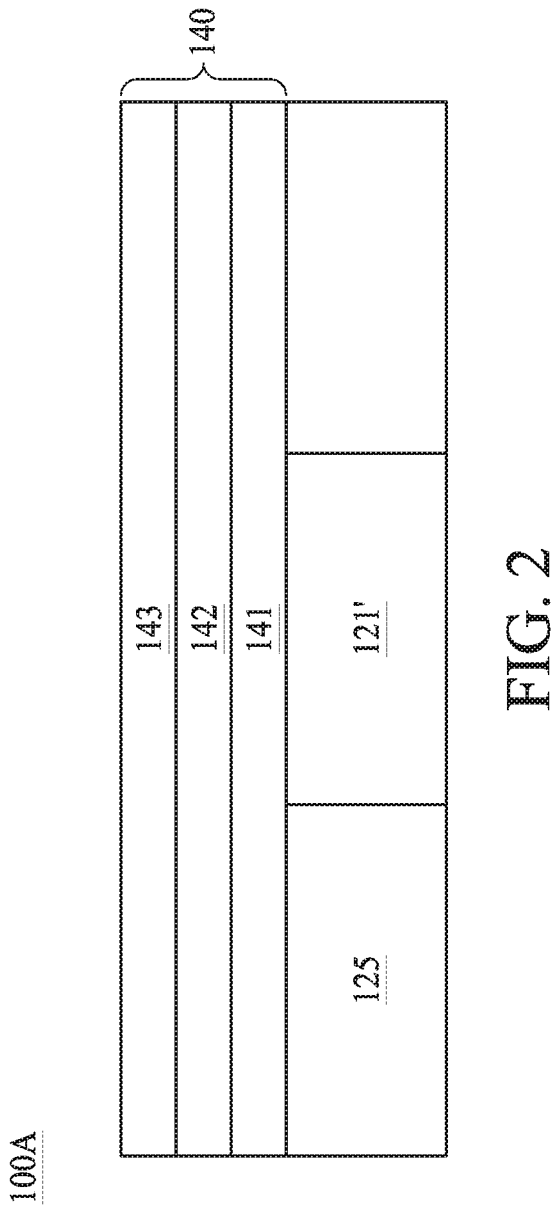

In FIG. 2, a dielectric layer 140 in a form of stacking layers is blanket deposited over a top surface of the $N^{th}$ metal line 121' and a top surface of the dielectric layer 135, in the MRAM cell region 100A. The stacking layers may include a first silicon carbide (SiC) layer 141, a tetraethyl orthosilicate (TEOS)/silicon-rich oxide (SRO) layer 142 and a second SiC layer 143 according to an exemplary embodiment of the present disclosure. The dielectric layer 140 can be formed by a variety of techniques, e.g., chemical vapor deposition (CVD), low-pressure CVD (LPCVD), plasma-enhanced CVD (PECVD), sputtering and physical vapor deposition (PVD), thermal growing, and the like.

Figure 3:
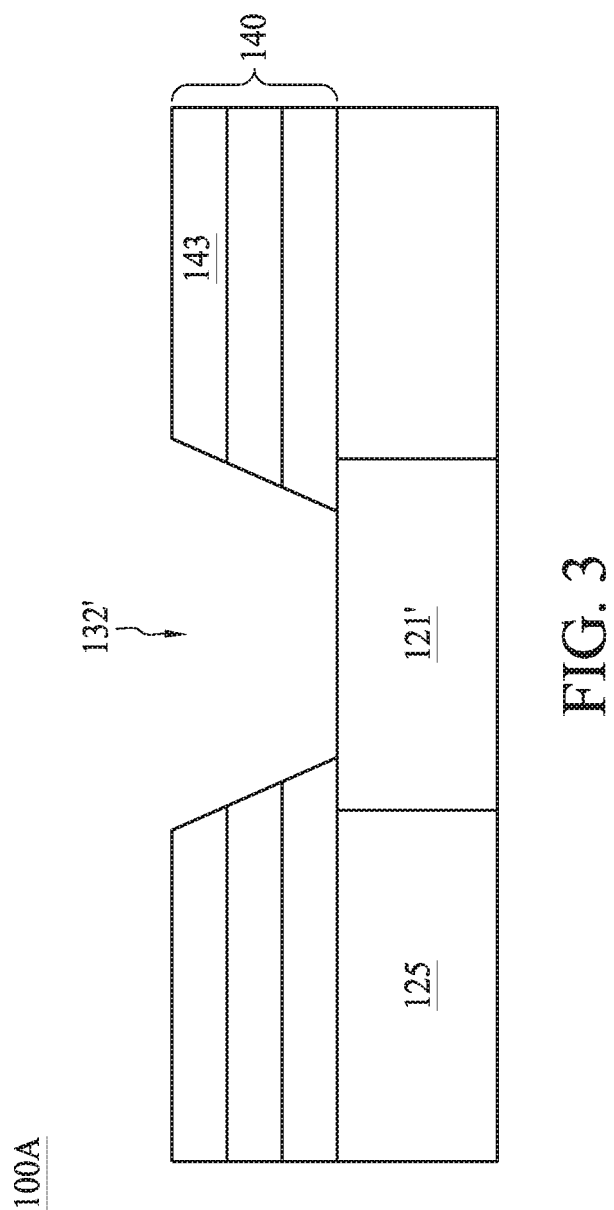

In FIG. 3, a photoresist layer (not shown) is patterned over the dielectric layer 140 to expose a bottom electrode via (BEVA) hole 132' of the MRAM structure. As shown in FIG. 3, the BEVA hole 132' is formed in the dielectric layer 140 by a suitable dry etch operation. In some embodiments, the dry etch in the present operation includes reactive ion etch (RIE) adopting fluorine-containing gases. In some embodiments, the present dry etch operation can be any suitable dielectric etch to be formed via trenches in a metallization structure of conventional CMOS technology.

Figure 4:
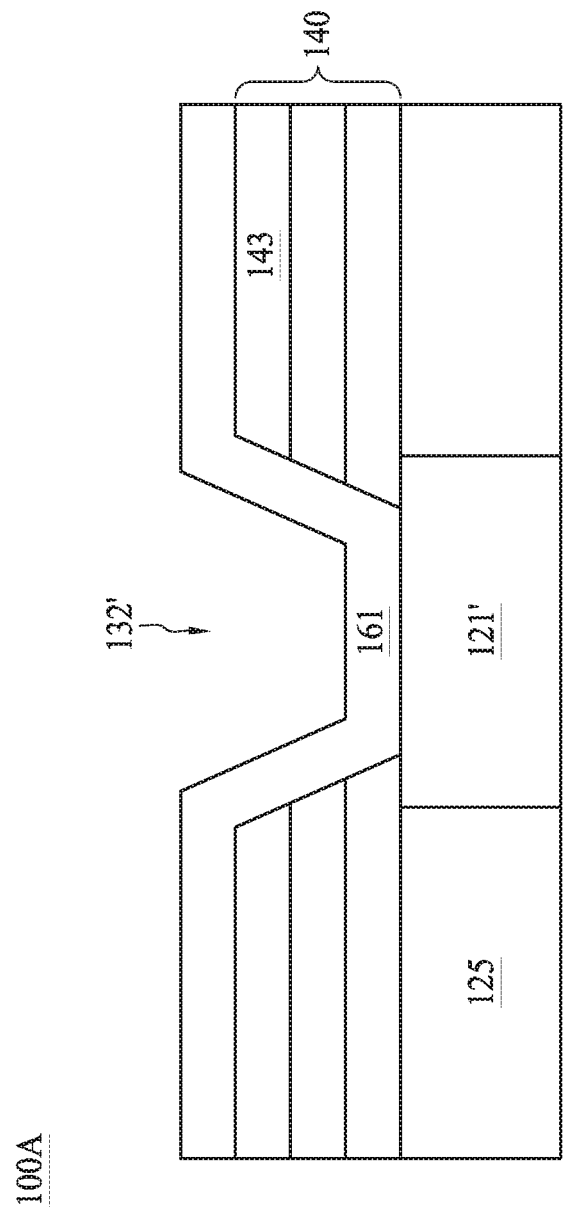
Figure 5:
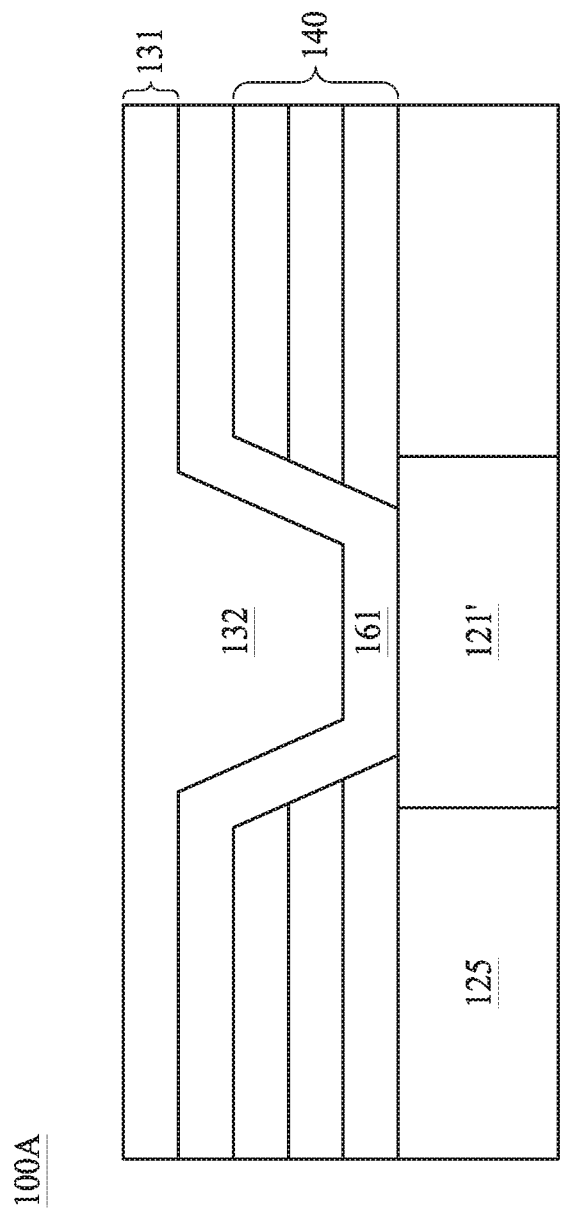

In FIG. 4, a lining layer 161 is blanket lined over the BEVA hole 132' in the MRAM cell region 100A and over the dielectric layer 140. In the exemplary embodiment, the lining layer 161 conformally covers an interior surface of the BEVA hole 132' and a top surface of the dielectric layer 140 as shown in FIG. 4. Subsequently, in FIG. 5, a deposition of BEVA material 132 is conducted to be disposed over the lining layer 161 and the dielectric layer 140. In some embodiments, an overfilling of the BEVA material 132 is carried out. In other words, a level of the BEVA material 132 is at least higher than the top surface of the dielectric layer 140 so that the BEVA hole 132' is substantially filled by the BEVA material 132. The portion overfilling the BEVA hole 132' may be configured to be a bottom electrode 131 of the MRAM. In some embodiments, the BEVA material 132 includes TiN, TaN, W, Al, Ni, Ta, Ru, Co, Cu or the combination thereof, deposited by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like.

Figure 6:
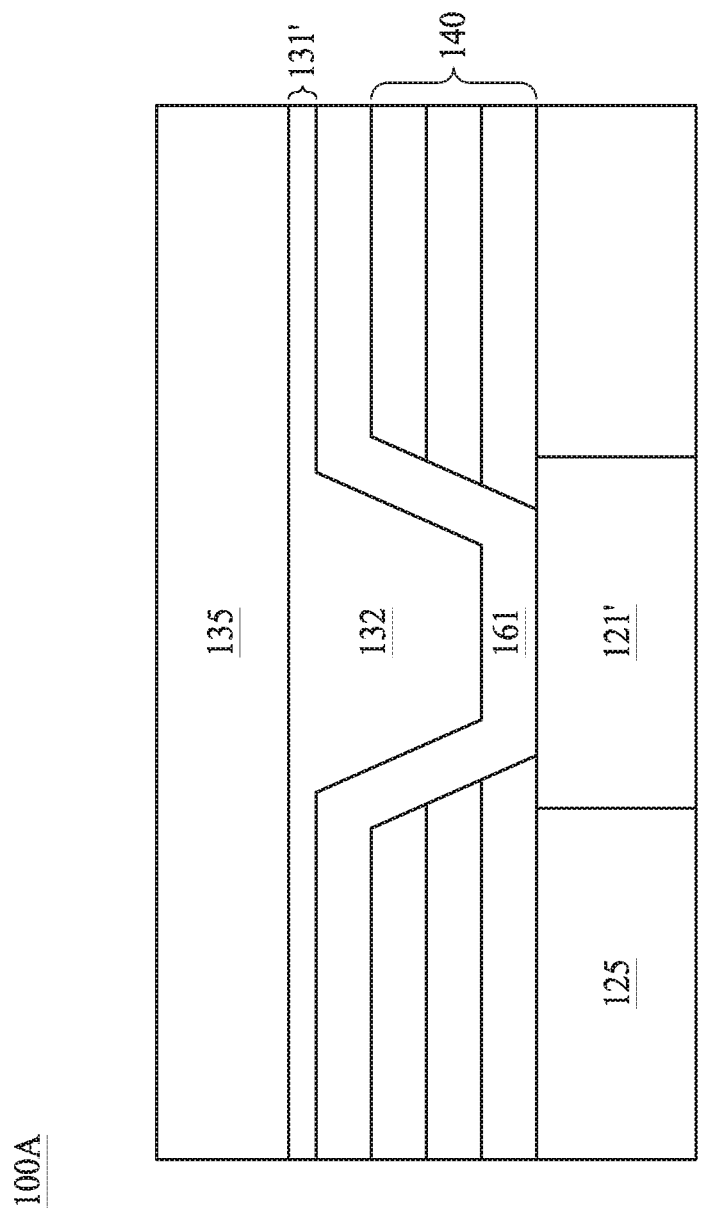

In FIG. 6, a portion of the bottom electrode 131 is removed through a thinning process to obtain a thinned bottom electrode 131'. In some embodiments, the bottom electrode 131 may be thinned through a chemical-mechanical polish (CMP) planarization process. An MTJ layer 135 is deposited in a form of multiple material stacks (with details of the multiple material stacks not illustrated in FIG. 6) over the bottom electrode 131'. In some embodiments, the MTJ layer 135 may have a thickness in a range from about 150 Å to about 200 Å. In some embodiments, the MTJ layer 135 may have a thickness in a range from about 150 ↑ to about 250 Å. The MTJ layer 135 may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the MTJ 135 may include ferromagnetic layers, spacers, and a capping layer. The capping layer may be formed on the ferromagnetic layer. In some embodiments, a seed layer (not shown) may be formed between the bottom electrode 131' and the MTJ layer 135. The seed layer may be in a form of stacking layers blanket deposited over a top surface of the bottom electrode 131' of the MRAM in the MRAM cell region 100A

Each of the ferromagnetic layers may include ferromagnetic material, which may be metal or metal alloy, for example, Fe, Co, Ni, CoFeB, FeB, CoFe, FePt, FePd, CoPt, CoPd, CoNi, TbFeCo, CrNi or the like. The spacer may include non-ferromagnetic metal, for example, Ag, Au, Cu, Ta, W, Mn, Pt, Pd, V, Cr, Nb, Mo, Tc, Ru or the like. Another spacer may also include an insulator, for example, $Al_2O_3$, MgO, TaO, RuO or the like. The capping layer may include non-ferromagnetic material, which may be a metal or an insulator, for example, Ag, Au, Cu, Ta, W, Mn, Pt, Pd, V, Cr, Nb, Mo, Tc, Ru, Ir, Re, Os, $Al_2O_3$, MgO, TaO, RuO or the like. The capping layer may reduce write current of its associated MRAM cell. The ferromagnetic layer may function as a free layer whose magnetic polarity or magnetic orientation can be changed during write operation of its associated MRAM cell. The ferromagnetic layers and the spacer may function as a fixed or pinned layer whose magnetic orientation may not be changed during operation of its associated MRAM cell. It is contemplated that the MTJ layer 135 may include an anti-ferromagnetic layer in accordance with other embodiments.

Figure 7:
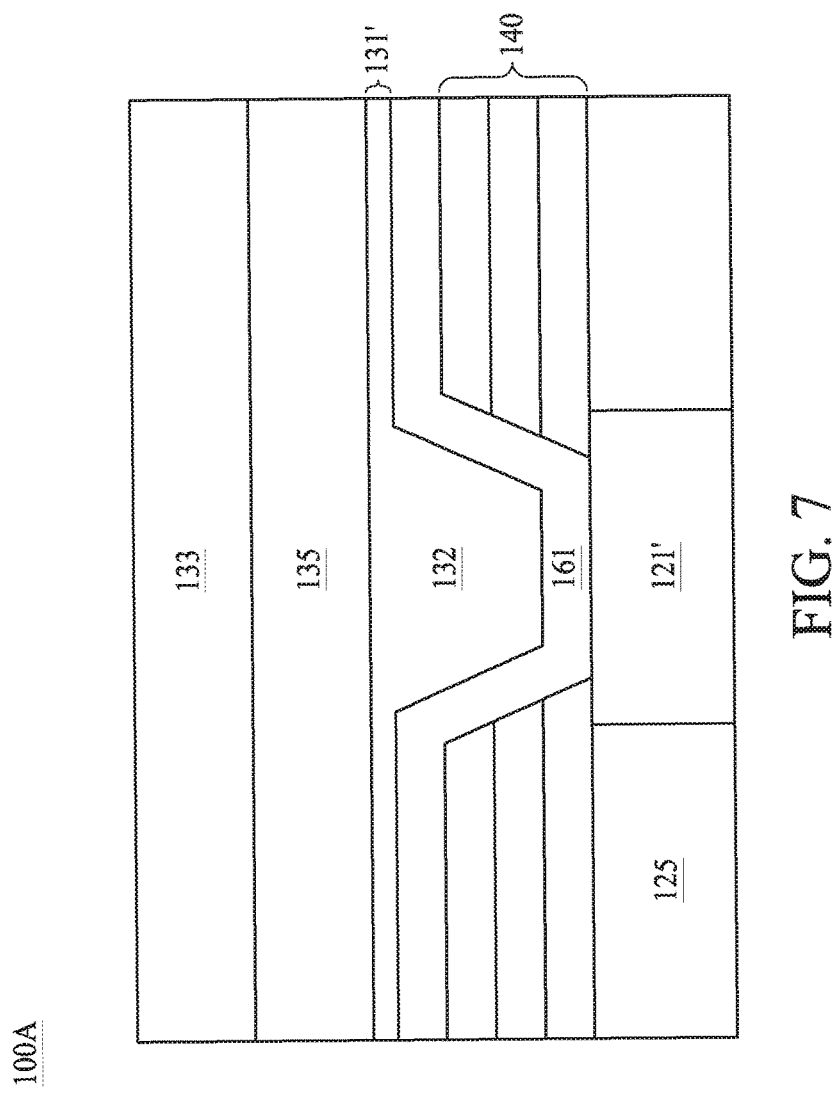

Following the formation of the MTJ layer 135, a top electrode layer 133 is deposited over the MTJ layer 135 as shown in FIG. 7. The top electrode layer may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the top electrode layer may include TiN, TaN, Ta or Ru.

Figure 8:
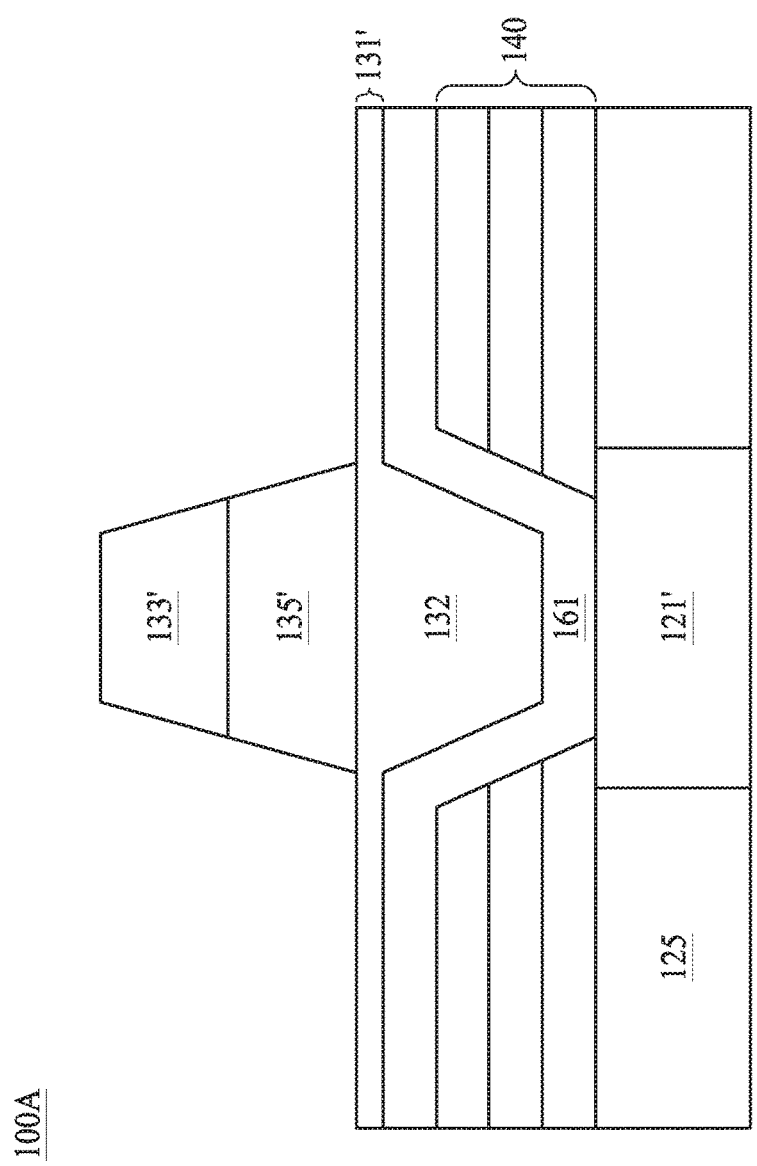

After the MTJ layer 135 and the top electrode layer 133 are formed over the bottom electrode layer 131', and a mask layer (not shown) is formed over the top electrode layer 133 for the ensuing MRAM structure formation. The mask layer may have a multi-layer structure, which may include, for example, an oxide layer, an advanced patterning film (APF) layer and an oxide layer. Each of the oxide layer, the APF layer, and the oxide layer may be formed by a variety of techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. In some embodiments, the mask layer is configured to pattern the top electrode layer 133 and the MTJ layer 135 to form a top electrode 133' and an MTJ 135' as shown in FIG. 8. In some embodiments, the MTJ 135' and the top electrode 133' are formed by a Reactive Ion Etch (RIE) plasma method. In some embodiments, the MTJ 135' and the top electrode 133' together may have a substantial trapezoidal or rectangular shape from a cross-sectional view. However, this is not a limitation of the present disclosure. In some embodiments, the MTJ 135' and the top electrode 133' together may form other shapes from a cross-sectional view.

Figure 9:
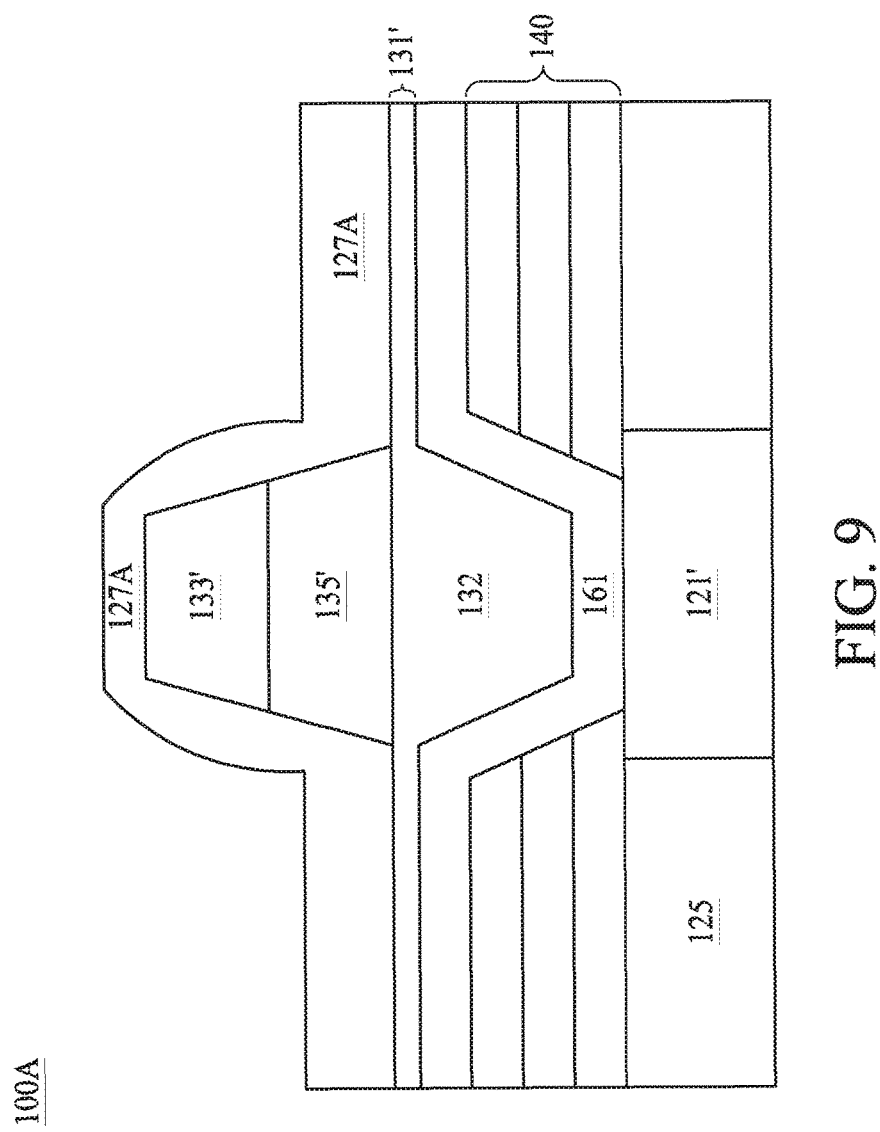

Subsequently, a first spacer layer 127A possessing a thickness of from about 50 Å to about 300 Å is blanket deposited over the MTJ 135', the top electrode 133' and the bottom electrode 131' as shown in FIG. 9. Note that a sidewall of the MTJ 135' and a sidewall of the top electrode 133' are surrounded and encompassed by the first spacer layer 127A to prevent oxidation or other contamination. The first spacer layer 127A may include dielectric materials such as SiN deposited using a low-temperature deposition process, for example PECVD in a range of approximately 100° C. to 350° C. In the exemplary embodiment, the first spacer layer 127A is deposited at a temperature of about 180° C. A low-temperature deposition process for forming the first spacer layer 127A will prevent damage to the magnetoresistive structure of the MTJ 135', which is sensitive to higher temperatures, for example above 400° C. The low-temperature deposited first spacer layer 127A may have a dielectric constant of about 1.85.

Figure 10:
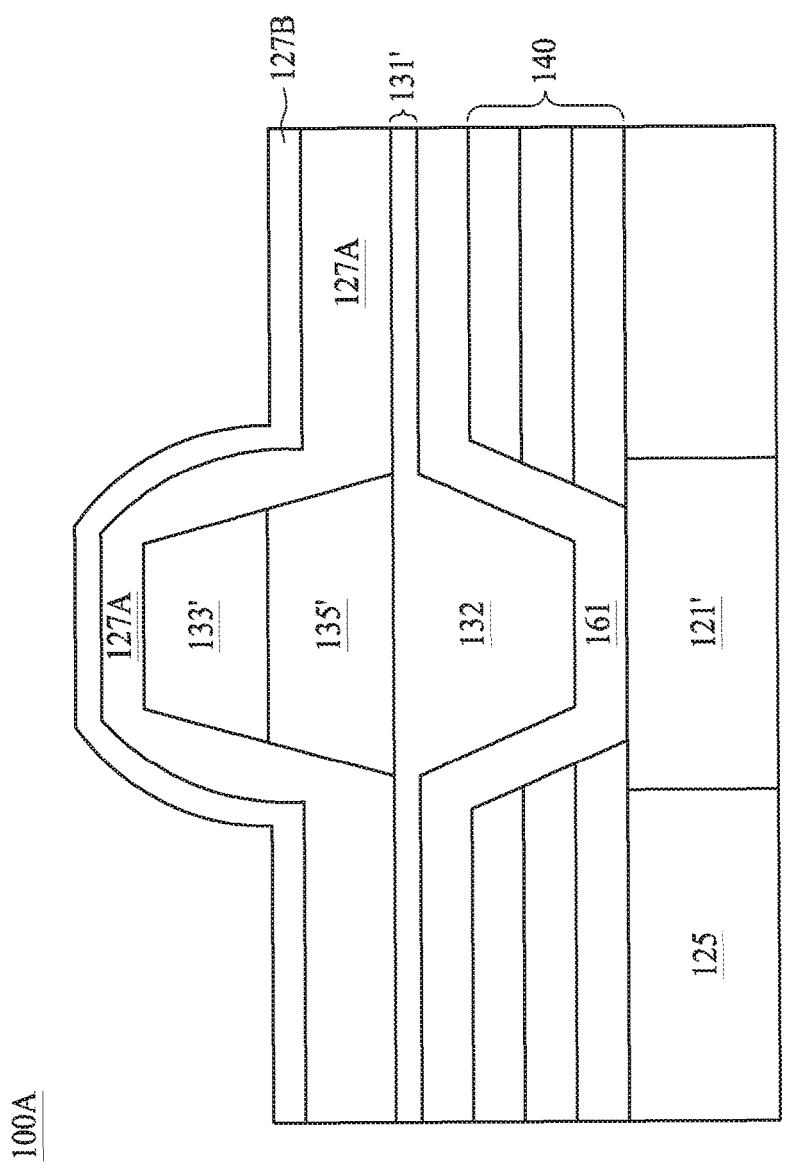

After depositing the first spacer layer 127A, a second spacer layer 127B possessing a thickness of from about 25 Å to about 200 Å is blanket deposited over the first spacer layer 127A as shown in FIG. 10. The second spacer layer 127B may include dielectric materials such as SiN deposited using a high-temperature deposition process which is different from the low-temperature deposition process conducted to the first spacer layer 127A. For example, the high-temperature deposition process may be PECVD in a range of approximately 400° C. to 450° C. In the exemplary embodiment, the second spacer layer 127B is deposited at a temperature of about 400° C. The high-temperature deposited second spacer layer 127B may have an atom density higher than that of the low-temperature deposited first spacer layer 127A. The high-temperature deposited second spacer layer 127B may have a dielectric constant of about 2, which is greater than that of the low-temperature deposited first spacer layer 127A. The first spacer layer and the second spacer layer 127B together form a composite SiN layer or a multi-layered SiN layer. In the exemplary embodiment, the second spacer layer 127B is thinner than the first spacer layer 127A. Comparing with the first spacer layer 127A, the second spacer layer 127B with a higher atom density is more capable of resisting corrosion of a thin tunneling barrier layer including metallic oxide materials, such as MgO, in the MTJ 135' by chlorine during the subsequent etching process, in particular the bottom electrode etching process.

Figure 11:
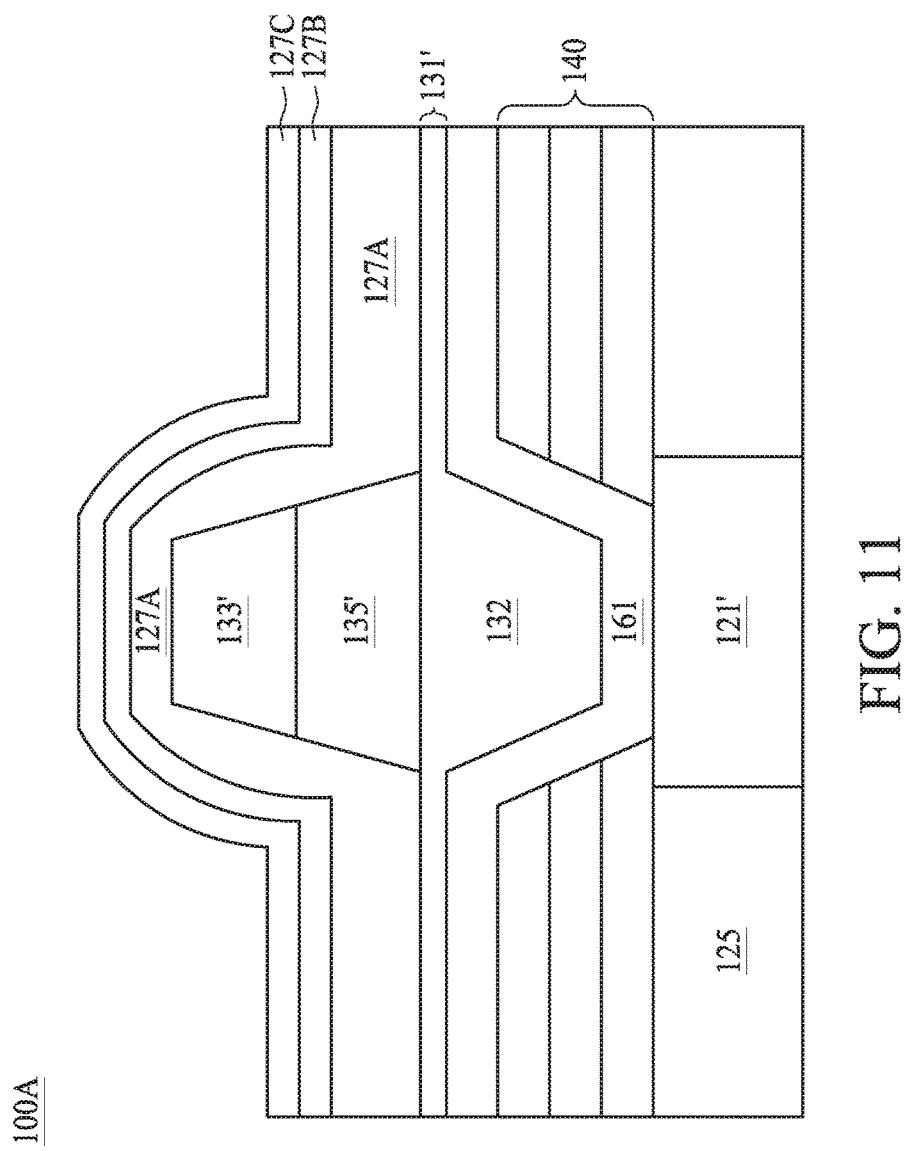

After depositing the second spacer layer 127B, a third spacer layer 127C is blanket deposited over the second spacer layer 127B as shown in FIG. 11. The third spacer layer 127C may include dielectric materials such as oxide. In the exemplary embodiment, the third spacer layer 127C is thinner than the first spacer layer 127A. Comparing with the existing oxide layer deposited over the existing single-layered SiN layer, the third spacer layer 127C is thicker. The existing oxide layer generally has a width of about 50 Å, but the third spacer layer 127C possesses a thickness of from about 75 Å to about 150 Å. The thicker third spacer layer 127C can further strengthen the resistibility to Chlorine.

Figure 12:
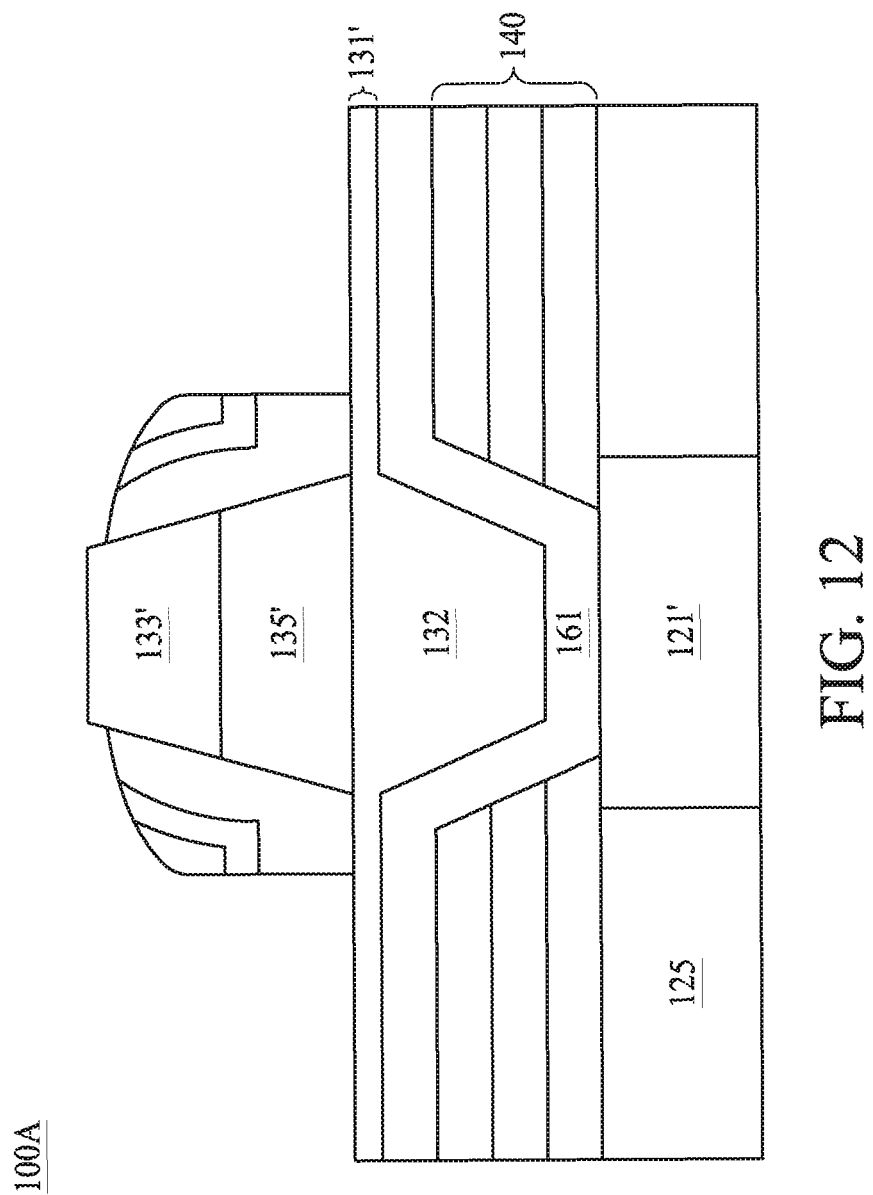

Then, as shown in FIG. 12, the first spacer layer 127A, the second spacer layer 127B and the third spacer layer 127C are patterned to expose a top surface of the top electrode 133' and a portion of the bottom electrode 131'. In particular, the third spacer layer 127C may be etched by fluorine-based etching gas, such as $CF_4$; and the first spacer layer 127A, the second spacer layer 127B may be etched by mixed gas of $CH_2F_2$, $O_2$, and Ar.

Figure 13:
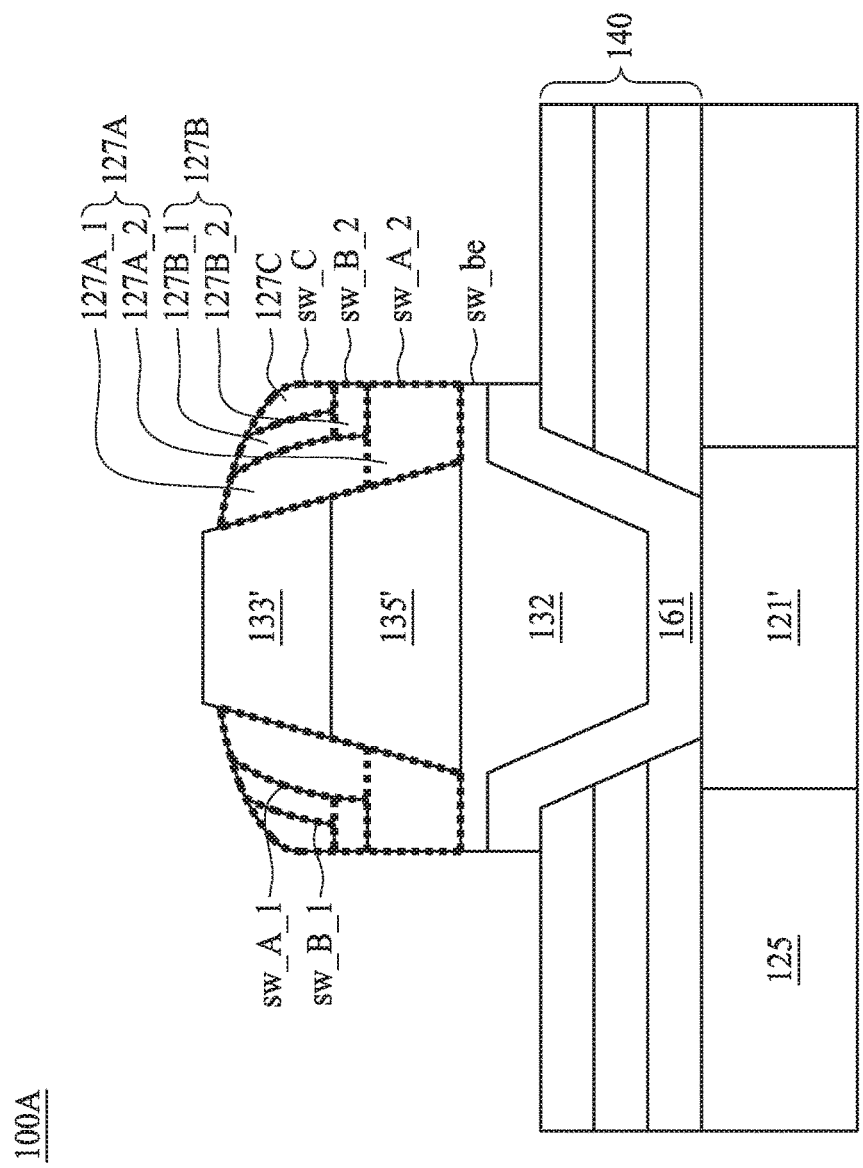

Referring to FIG. 13, the bottom electrode 131' and the lining layer 161 are then etched by etching gas such as chlorine gas to align to the patterned the first spacer layer 127A, the second spacer layer 127B and the third spacer layer 127C. In this way, two adjacent MRAMs are electrically decoupled. The dielectric layer 140 is exposed. The enhanced multi-layered spacer 127A-127C can make sure the thin tunneling barrier layer, typically a layer of metallic oxide materials, such as MgO, in the MTJ 135' free from damage caused by chlorine.

As can be seen from the cross-sectional view of FIG. 13, the bottom electrode 131' and the lining layer 161 are substantially laterally wider than the MTJ 135' and the top electrode 133'. The first spacer layer 127A includes a first region 127A_1 and a second region 127A_2. The first region 127A_1 is disposed on the second region 127A_2. The second region 127A_2, like a base with a larger diameter than that of the first region 127A_1, laterally protrudes from the first region 127A_1 and extends outwardly until completely covering a top surface of the bottom electrode 132. When etching the bottom electrode 132, the multi-layered spacer 127A-127C may be used as a mask to define the dimension of the bottom electrode 132. Therefore, a sidewall sw_A_2 of the second region 127A_2 substantially aligns with a sidewall sw_be of the bottom electrode 132 around an interface between the first spacer layer 127A and the bottom electrode 132. The first region 127A_1 laterally encompasses at least a portion of the top electrode 133' and the MTJ 135'. The second region 127A_B laterally encompasses at least a portion of the MTJ 135' only.

The second spacer layer 127B includes a first region 127B_1 and a second region 127B_2. The first region 127B_1 is disposed on the second region 127B_2. The second region 127B_2, like a base with a larger thickness than that of the first region 127B_1, laterally protrudes from the first region 127B_1 and extends outwardly until completely covering a top surface of the second region 127A_1. A sidewall sw_B_2 of the second region 127B_2 may substantially align with the sidewall sw_A_2 of the second region 127A_2 around an interface between the first spacer layer 127A and the second spacer layer 127B to form an approximately continuous profile as shown in FIG. 13. The first region 127B_1 and the second region 127A_B together laterally encompass at least a portion of the sidewall sw_A_1 of the first region 127A_1. The third spacer layer 127C laterally encompasses at least a portion of the first region 127B_1. A sidewall sw_C of the third spacer layer 127C may substantially align with the sidewall sw_B_2 of the second region 127B_2 around an interface between the third spacer layer 127C and the second spacer layer 127B to form an approximately continuous profile as shown in FIG. 13.

In addition, a height of the first spacer layer 127A is greater than a height of the second spacer layer 127B; and the height of the second spacer layer 127B is greater than a height of the third spacer layer 127C. A height of the first region 127A_1 is greater than a height of the first region 127B_1. The height of the first region 127B_1 is greater than the height of the third spacer layer 127C. A width of the second region 127A_2 from the sidewall of the MTJ 125' to the sidewall sw_$A_{13}$_2 of the second region 127A_2 is greater than a width of the second region 127B_2 from the sidewall sw_A_1 of the first region 127A_1 to the sidewall sw_B_2 of the second region 127B_2. The width of the second region 127B_2 is greater than a thickness of the third spacer layer 127C from the sidewall sw_B_1 of the first region 127B_1 to the sidewall sw_C of the third spacer layer 127C.

Figure 14:
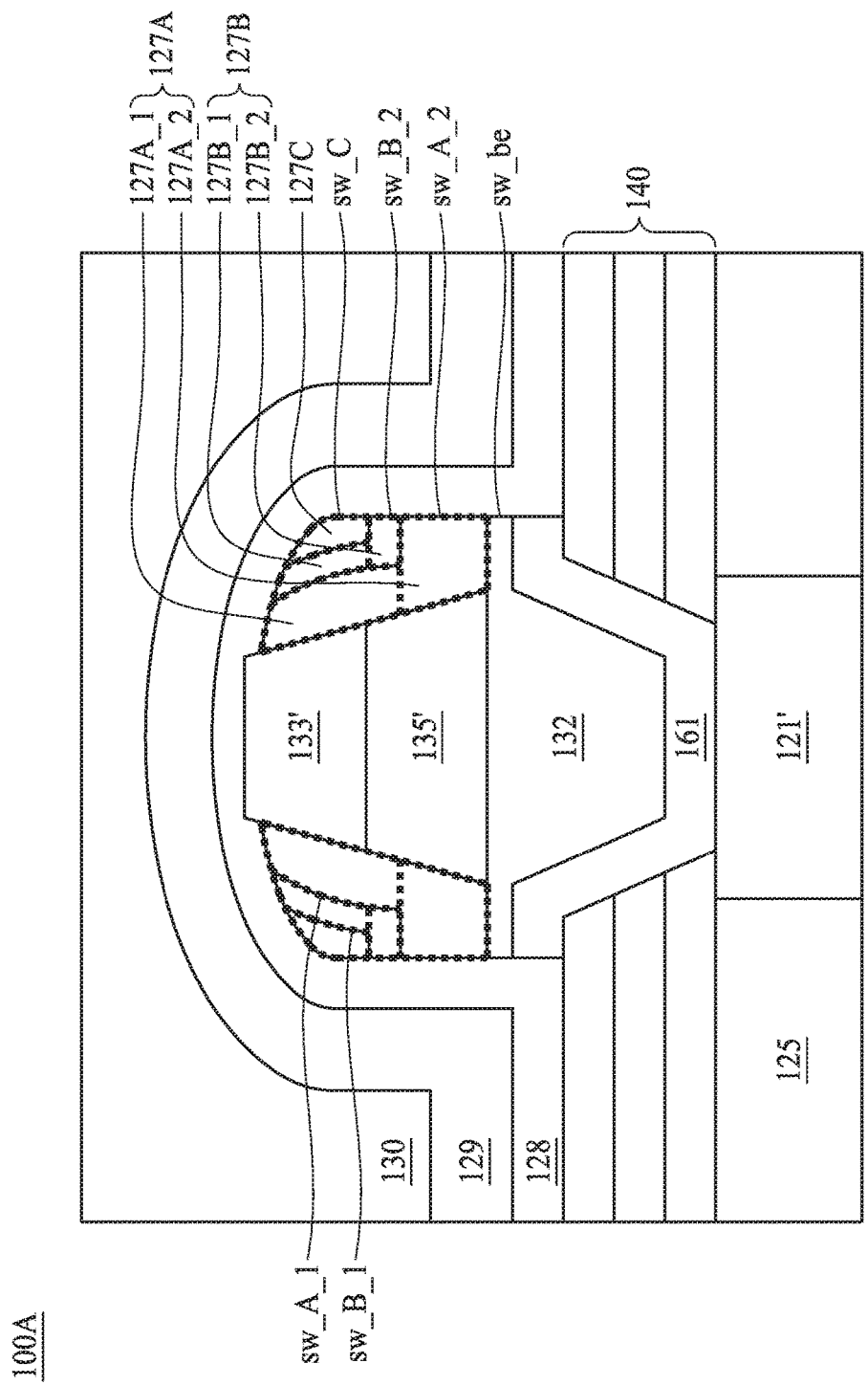

In FIG. 14, a dielectric layer 128 is conformally deposited over the patterned first spacer layer 127A, second spacer layer 127B, third spacer layer 127C, the top electrode 133', sidewalls of the bottom electrode 131' and the lining layer 161, and the dielectric layer 140. In some embodiments, the dielectric layer 128 is composed of the same materials as the first spacer layer 127A. Another dielectric layer 129 is further formed to conformally cover the dielectric layer 128. Optionally, an anti-reflection layer 130 is leveled over the dielectric layer 129 to facilitate the following photolithography operation.

Figure 15:
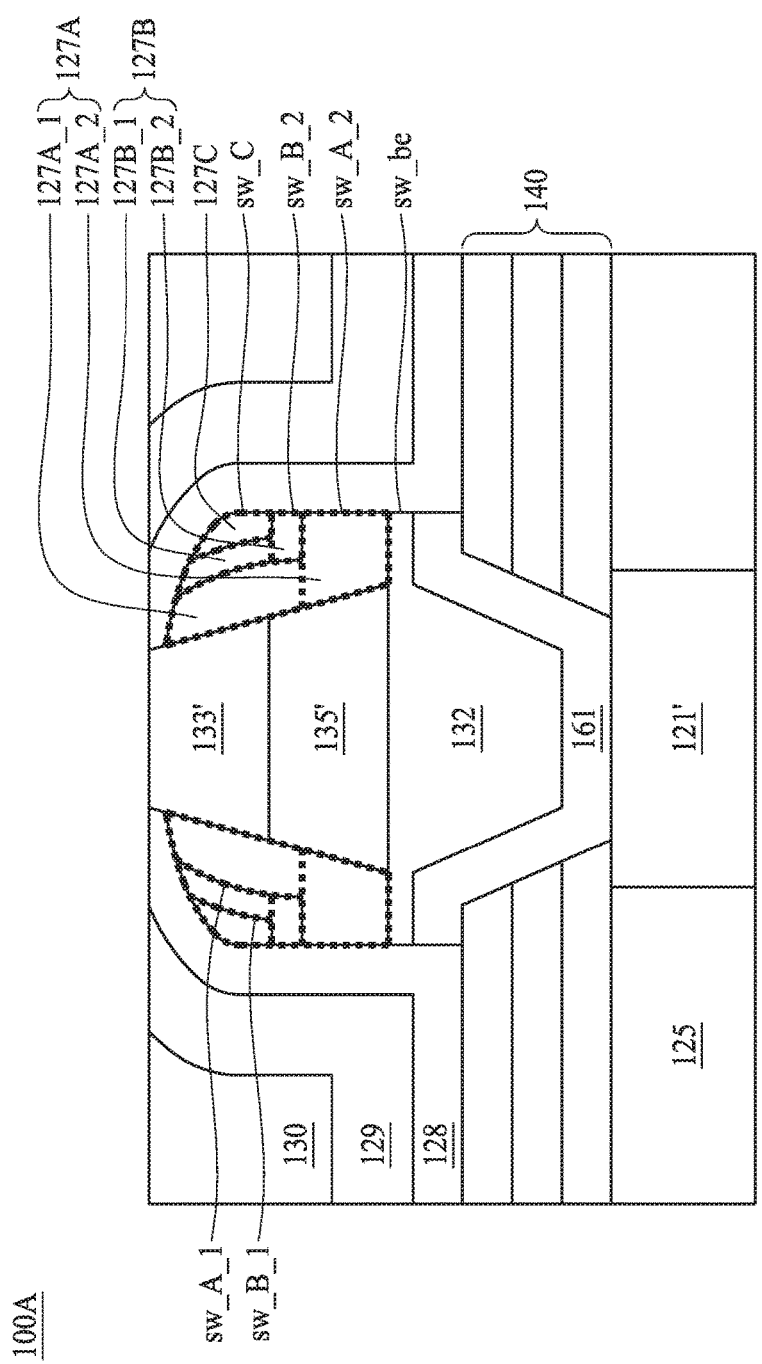

In FIG. 15, a planarization operation is performed on the anti-reflection layer 130 and the dielectric layer 129 such that the top surface of the dielectric layer 129 is substantially flat across the MRAM cell region 100A. As shown in 15, a non-selective etch is adopted to remove the dielectric layer 129, the anti-reflection layer 130, and the dielectric layer 128 using $CF_y$-based etchant chemistry, where y is a positive integer. For example, $CF_y$-based etchant chemistry includes $CF_y$ and other etching gases composed of C, H, and F. In some embodiments, the $CF_y$-based etchant chemistry has a $C_nH_lF_m:CF_y$ volume ratio in a range of from 0 to about 0.1. In some embodiments, the non-selective etch is carried out under 0% to 5% of oxygen gas flow with respect to total gas flow. The non-selective etch is performed by endpoint detection mode so as to stop upon the exposure of the dielectric layer 128. Alternatively stated, at the completion of the non-selective etch, the top surface of the top electrode 133' is not exposed.

Figure 16:
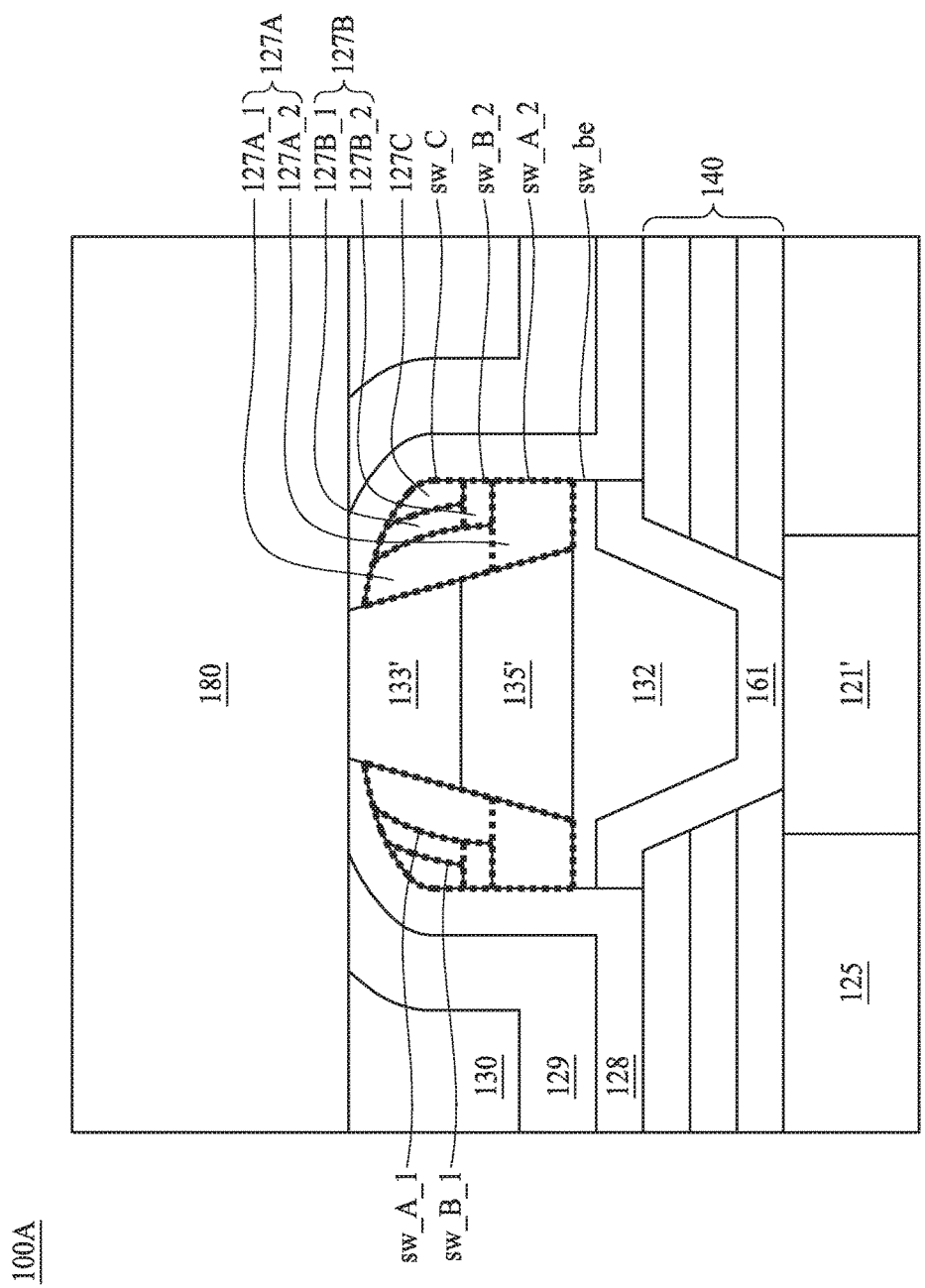
Figure 17:
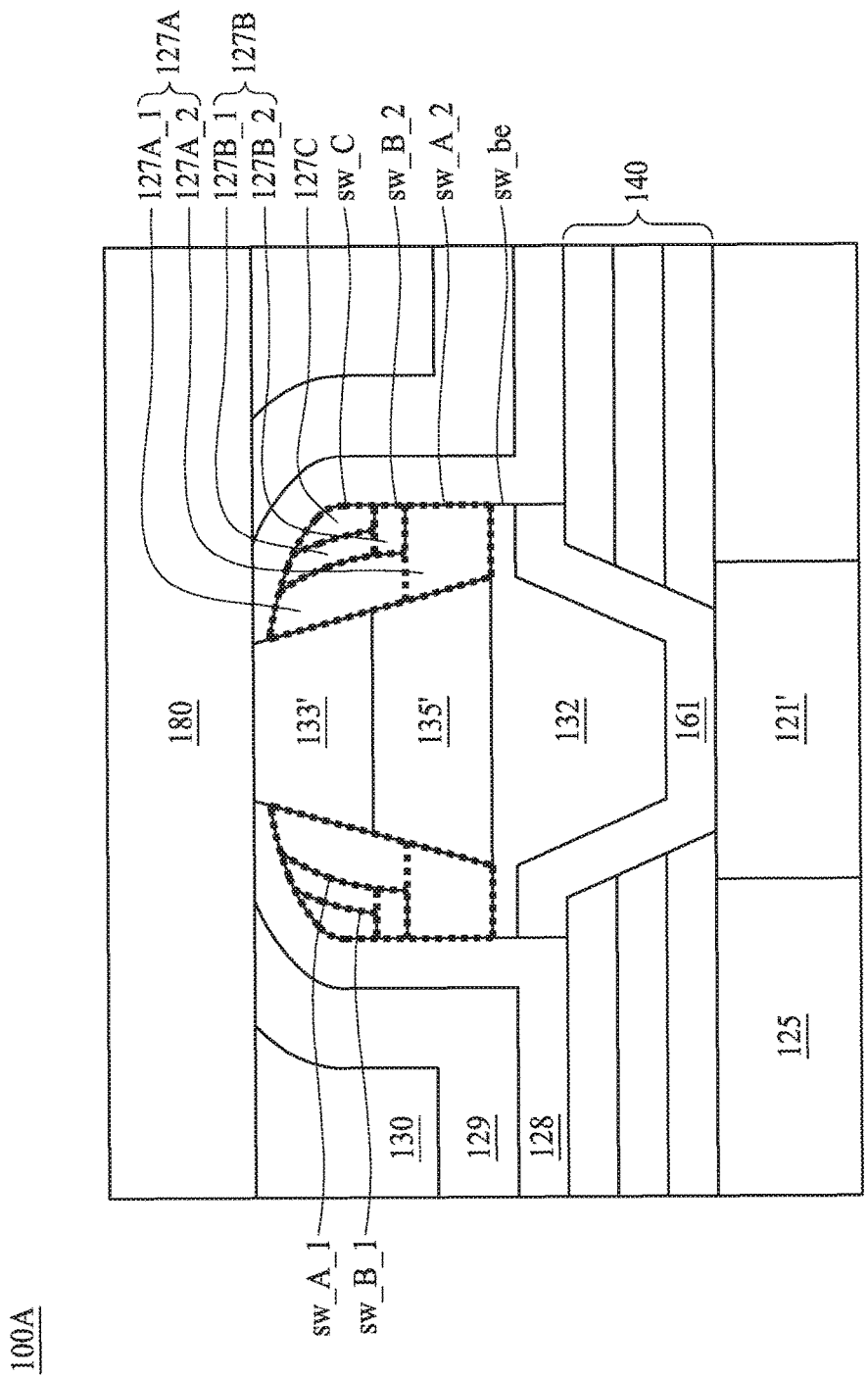
Figure 18:
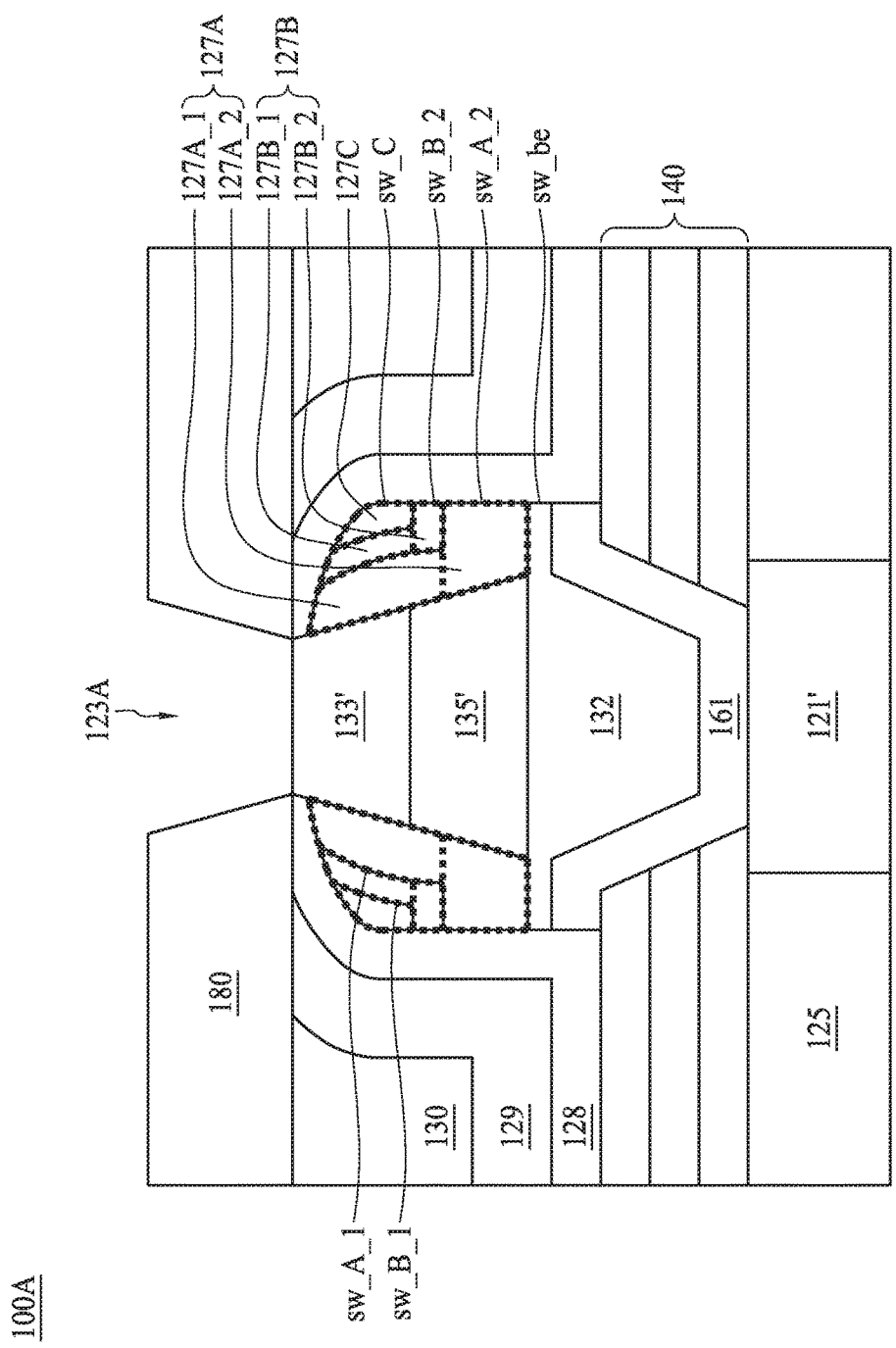

In FIG. 16, a low-k dielectric layer composite 180 is formed to cover the MRAM cell region 100A. In FIG. 17, an etch back operation is performed for the following trench formation in the MRAM cell region 100A. In FIG. 18, a photoresist (not shown) is patterned over the planarized dielectric surface to form trenches for metal lines and metal vias. For example, in the MRAM cell region 100A, a $(N+1)^{th}$ metal line trench 123A is formed over the MTJ 135', exposing a top surface of the top electrode 133' of the MTJ 135'. If the top electrode 133' is composed of a material with a high oxidation rate, such as TaN, a considerable thick oxide layer can be observed on the top surface of the top electrode 133' since said top surface is exposed after the formation of the metal line trench 123A. Conventionally, an oxide bombardment operation is used to remove the oxide layer. If the top electrode 133' is composed of a material with a low oxidation rate, such as TiN, very little or even no oxide layer can be observed on the top surface of the top electrode 133. In this connection, no oxide bombardment operation is required to remove such oxide layer, and the sidewall/bottom integrity of the $N^{th}$ metal via trench and an $(N+1)^{th}$ metal line trench 123B can be preserved.

Figure 19:
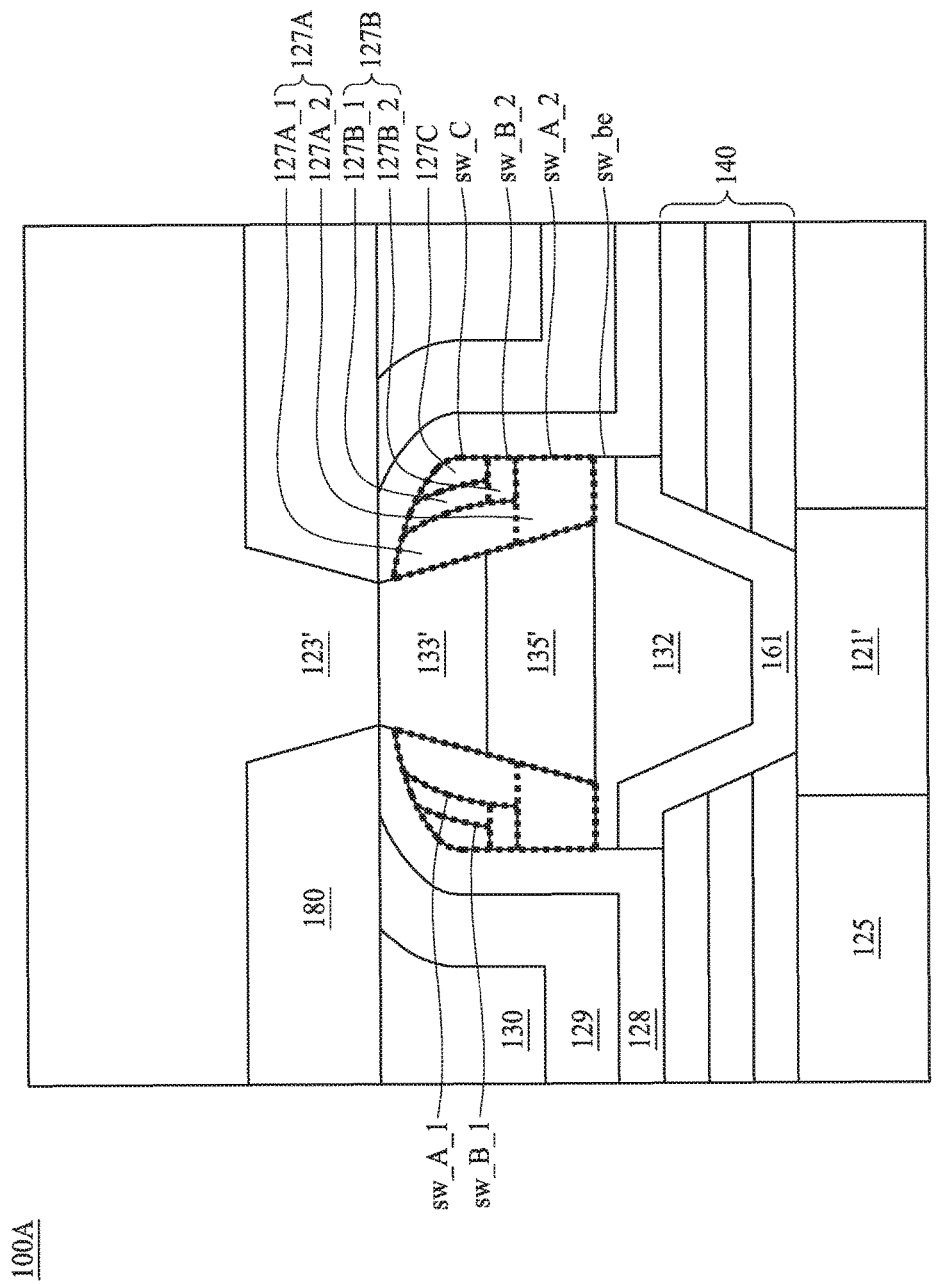
Figure 20:
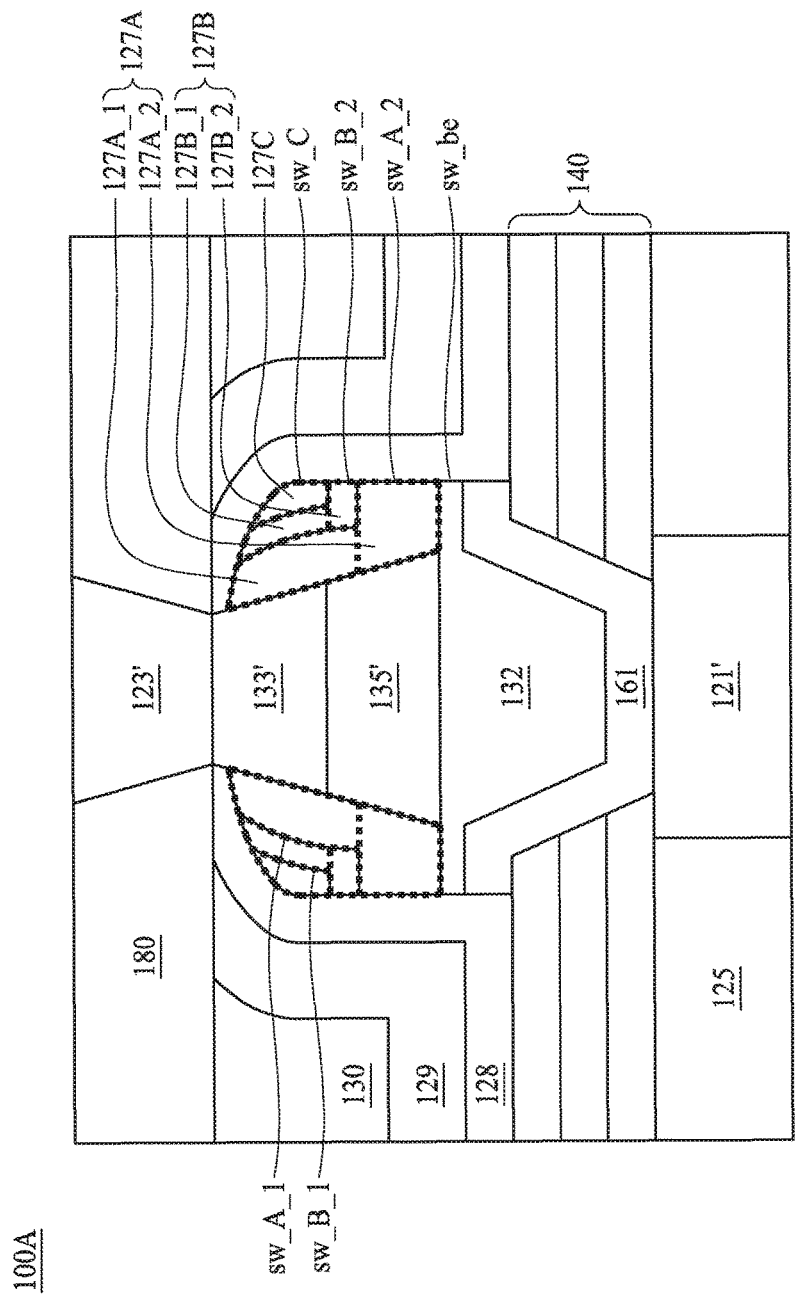

In FIG. 19 and FIG. 20, conductive metal fills the metal line trench/metal via trench (hereinafter "trenches") through, for example, a conventional Dual Damascene operation. The patterned trenches are filled with a conductive material by an electroplating operation, and excess portions of the conductive material are removed from the surface using a chemical mechanical polishing (CMP) operation, an etch operation, or combinations thereof. Details of electroplating the trenches are provided below. An $(N+1)^{th}$ metal line 123' may be formed from W, and more preferably from copper (Cu), including AlCu (collectively, Cu). In one embodiment, the $(N+1)^{th}$ metal lines 123' are formed using the Damascene operation, which should be familiar to those skilled in the art. First, trenches are etched through the low k dielectric layer. This process can be performed by a plasma etch operation, such as an Inductively Coupled Plasma (ICP) etch. A dielectric liner (not shown) then may be deposited on the trench sidewalls. In some embodiments, the liner materials may include silicon oxide ($SiO_x$) or silicon nitride ($SiN_x$), which may be formed by a plasma deposition process, such as physical vapor deposition (PVD) or chemical vapor deposition (CVD) including plasma enhanced chemical vapor deposition (PECVD). Next, a seed layer of Cu is plated in the trenches. Note that the seed layer of Cu may be plated over a top surface of the top electrode 133'. Then a layer of copper is deposited in the trenches, followed by planarization of the copper layer, such as by chemical mechanical polishing (CMP), down to the top surface of a low k dielectric layer. The exposed copper surface and dielectric layer can be coplanar.

Subsequent processing may further include forming various contacts/vias/lines and multi layer interconnect features (e.g., metal layers and interlayer dielectrics) over the substrate, configured to connect the various features or structures of the integrated circuit device. The additional features may provide electrical interconnection to the device including the formed metal gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The disclosed multi-layered spacer, including an outmost oxide layer and a multi-layered SiN layer with each SiN layer is formed under a temperature different from other SiN layer, is stronger than existing spacer structures. As such, all or most part of the thin tunneling barrier layer, typically a layer of metallic oxide materials, such as MgO, can be free from being etched away by chlorine gas during the bottom electrode etching process. The peeling of the MTJ can be mitigated and therefore the yield and reliability are improved. For example, a failure rate of an existing MTJ structure having a single-layered SiN layer (low temperature SiN layer only) with a thickness of about 300 Å and an oxide layer with a thickness of about 50 Å is about 93.7%. However, a failure rate of a disclosed MTJ structure having a multi-layered SiN layer (composite SiN layer with a high temperature SiN layer and a low temperature) with a thickness of about 250 Å and an oxide layer with a thickness of about 50 Å can be reduced to about 34.74%. Moreover, a failure rate of another disclosed MTJ structure having a multi-layered SiN layer (high temperature SiN layer and low temperature) with a thickness of about 250 Å and an oxide layer with a thickness of about 75 Å can be further reduced to about 3.3%; and a failure rate of still another MTJ structure having a multi-layered SiN layer (high temperature SiN layer and low temperature) with a thickness of about 250 Å and an oxide layer with a thickness increased to about 100 Å can be even reduced to about 0%.

Some embodiment of the present disclosure provides a semiconductor structure. The semiconductor structure includes: an Nth metal layer; a bottom electrode over the Nth metal layer; a magnetic tunneling junction (MTJ) over the bottom electrode; a top electrode over the MTJ; a spacer, including: a first spacer layer including SiN with a first atom density, the first spacer layer laterally encompassing the MTJ; and a second spacer layer including SiN with a second atom density different from the first atom density, the second spacer layer laterally encompassing at least a portion of the first spacer layer; and an (N+1)th metal layer over the top electrode.

Some embodiment of the present disclosure provides a semiconductor structure. The semiconductor structure includes: a bottom electrode; a magnetic tunneling junction (MTJ) over the bottom electrode; a top electrode over the MTJ; and a spacer, including: an inner SiN layer with a first Y, the inner SiN layer laterally encompassing the MTJ; and an outer SiN layer with a second Y different from the first Y, the outer SiN layer laterally encompassing at least a portion of the inner SiN layer.

Some embodiment of the present disclosure provides a method for manufacturing a semiconductor structure. The method includes: forming a bottom electrode; forming a magnetic tunneling junction (MTJ) layer over the bottom electrode; blanket depositing a first spacer layer with a first temperature over the bottom electrode and the MTJ; blanket depositing a second spacer layer with a second temperature over the first spacer layer, the second temperature being different from the first temperature; removing a portion of the first spacer layer and a portion of the second spacer layer to expose a portion of a top surface of the bottom electrode; and removing the exposed portion of the bottom electrode.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. A semiconductor structure, comprising:
an $N^{th}$ metal layer;
a bottom electrode over the $N^{th}$ metal layer;
a magnetic tunneling junction (MTJ) over the bottom electrode;
a top electrode over the MTJ;
a spacer, including:
a first spacer layer including SiN with a first dielectric constant, the first spacer layer laterally encompassing the MTJ; and
a second spacer layer including SiN with a second dielectric constant different from the first dielectric constant, the second spacer layer laterally encompassing at least a portion of the first spacer layer; and
an $(N+1)^{th}$ metal layer over the top electrode;
wherein a thickness of the bottom electrode directly below the MTJ is greater than a thickness of the bottom electrode directly below the second spacer layer, and a diameter of a top surface of the bottom electrode is wider than a diameter of a bottom surface of the bottom electrode.

2. The semiconductor structure of claim 1, wherein the second dielectric constant is greater than the first dielectric constant.

3. The semiconductor structure of claim 1, wherein the first spacer layer includes a first region and a second region, the first region of the first spacer layer being disposed on the second region of the first spacer layer, the second region of the first spacer layer laterally protruding from the first region of the first spacer layer and extending outwardly to cover the top surface of the bottom electrode.

4. The semiconductor structure of claim 3, wherein a sidewall of the second region of the first spacer layer substantially aligns with a sidewall of the bottom electrode at an interface between the first spacer layer and the bottom electrode.

5. The semiconductor structure of claim 3, wherein the first region of the first spacer layer laterally encompasses at least a portion of the top electrode.

6. The semiconductor structure of claim 4, wherein the second spacer layer includes a first region and a second region, the first region of the second spacer layer being disposed on the second region of the second spacer layer, the second region of the second spacer layer laterally protruding from the first region of the second spacer layer and extending outwardly to cover a top surface of the second region of the first spacer layer.

7. The semiconductor structure of claim 6, wherein a sidewall of the second region of the second spacer layer substantially aligns with the sidewall of the second region of the first spacer layer at an interface between the second spacer layer and the first spacer layer.

8. The semiconductor structure of claim 7, further comprising a third spacer layer including oxide, the third spacer layer laterally encompassing at least a portion of the second spacer layer.

9. The semiconductor structure of claim 8, wherein the third spacer layer covers the top surface of the second region of the second spacer layer.

10. The semiconductor structure of claim 9, wherein a sidewall of the third spacer layer substantially aligns with the sidewall of the second region of the second spacer layer at an interface between the third spacer layer and the second spacer layer.

11. A semiconductor structure, comprising:
a bottom electrode;
a magnetic tunneling junction (MTJ) over the bottom electrode;
a top electrode over the MTJ; and
a spacer, including:
an inner SiN layer with a first dielectric constant, the inner SiN layer laterally encompassing the MTJ; and
an outer SiN layer with a second dielectric constant different from the first dielectric constant, the outer SiN layer laterally encompassing at least a portion of the inner SiN layer;
wherein a thickness of the bottom electrode directly below the MTJ is greater than a thickness of the bottom electrode directly below the outer SiN layer, and a diameter of a top surface of the bottom electrode is wider than a diameter of a bottom surface of the bottom electrode.

12. The semiconductor structure of claim 11, wherein the second dielectric constant is greater than the first dielectric constant.

13. The semiconductor structure of claim 11, wherein a height of the inner SiN layer is greater than a height of the outer SiN layer.

14. The semiconductor structure of claim 11, further comprising an oxide layer laterally encompassing at least a portion of the outer SiN layer.

15. The semiconductor structure of claim 14, wherein a height of the inner SiN layer is greater than a height of the oxide layer.

16. The semiconductor structure of claim 11, wherein a thickness of the inner SiN layer is greater than a thickness of the outer SiN layer.

17. The semiconductor structure of claim 14, wherein a thickness of the inner SiN layer is greater than a thickness of the oxide layer.

18. A semiconductor structure, comprising:
a bottom electrode;
a magnetic tunneling junction (MTJ) over the bottom electrode;
a top electrode over the MTJ;
a first spacer layer including SiN with a first dielectric constant, the first spacer layer laterally encompassing the MTJ and the top electrode; and
a second spacer layer including SiN with a second dielectric constant different from the first dielectric constant, the second spacer layer laterally encompassing at least a portion of the first spacer layer;
wherein a thickness of the bottom electrode directly below the MTJ is greater than a thickness of the bottom electrode directly below the second spacer layer, and a diameter of a top surface of the bottom electrode is wider than a diameter of a bottom surface of the bottom electrode.

19. The semiconductor structure of claim 18, wherein the second dielectric constant is greater than the first dielectric constant.

20. The semiconductor structure of claim 18, further comprising a third spacer layer including oxide, the third spacer layer laterally encompassing at least a portion of the second spacer layer.

* * * * *